(12) United States Patent
Kondoh et al.

(10) Patent No.: US 6,194,743 B1
(45) Date of Patent: Feb. 27, 2001

(54) NITRIDE SEMICONDUCTOR LIGHT EMITTING DEVICE HAVING A SILVER P-CONTACT

(75) Inventors: You Kondoh, Yamato; Satoshi Watanabe, Kanagawa; Yawara Kaneko, Chigasaki, all of (JP); Shigeru Nakagawa, Goleta, CA (US); Norihide Yamada, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/212,150

(22) Filed: Dec. 15, 1998

(30) Foreign Application Priority Data

Dec. 15, 1997 (JP) .................................... 9-345584
Dec. 15, 1997 (JP) .................................... 9-345585

(51) Int. Cl.[7] .................................................... H01L 33/00
(52) U.S. Cl. ............................................. 257/94; 257/745
(58) Field of Search ........................................ 257/745, 94

(56) References Cited

U.S. PATENT DOCUMENTS

| | | | |
|---|---|---|---|
| 5,362,977 | 11/1994 | Hunt et al. ........................... | 257/98 |
| 5,684,523 | * 11/1997 | Satoh et al. ........................ | 347/247 |
| 5,703,436 | * 12/1997 | Forrest et al. ..................... | 313/506 |
| 5,959,307 | * 9/1999 | Nakamura et al. ................. | 257/14 |

FOREIGN PATENT DOCUMENTS

| | | | |
|---|---|---|---|
| 0550963A1 | 7/1993 | (EP) .............................. | H01L/33/00 |
| 0772249A2 | 5/1997 | (EP) .............................. | H01L/33/00 |
| 05291621 | 11/1993 | (JP) .............................. | H01L/33/00 |
| 09321389 | 12/1997 | (JP) .............................. | H01S/3/18 |

OTHER PUBLICATIONS

M. Kamiyama, Thin Film Handbook, p. 496, 1983, Ohmusya (Tokyo).*
Evans, P.W. et al., "Edge–Emitting Quantum Well Heterostructure Laser Diodes with Auxillary Native–Oxide Vertical Cavity Confinement", Applied Physics Letters, vol. 67, No. 21, Nov. 20, 1995, pp. 3168–3170.

* cited by examiner

*Primary Examiner*—Olik Chaudhuri
*Assistant Examiner*—Douglas A. Wille

(57) ABSTRACT

A light emitting device constructed on a substrate. The device includes an n-type semiconductor layer in contact with the substrate, an active layer for generating light, the active layer being in electrical contact with the n-type semiconductor layer. A p-type semiconductor layer is in electrical contact with the active layer, and a p-electrode is in electrical contact with the p-type semiconductor layer. The p-electrode includes a layer of silver in contact with the p-type semiconductor layer. In the preferred embodiment of the present invention, the n-type semiconductor layer and the p-type semiconductor layer are constructed from group III nitride semiconductor materials. In one embodiment of the invention, the silver layer is sufficiently thin to be transparent. In other embodiments, the silver layer is thick enough to reflect most of the light incident thereon. A fixation layer is preferably provided over the silver layer. The fixation layer may be a dielectric or a conductor, the choice depending on whether or not the silver layer is transparent.

5 Claims, 3 Drawing Sheets

NITRIDE SEMICONDUCTOR LIGHT EMITTING DEVICE HAVING A SILVER P-CONTACT

FIELD OF THE INVENTION

The present invention relates to light emitting electronic devices based on nitride semiconductors, and more particularly to an optoelectronic device that has improved optical and optoelectronic characteristics.

BACKGROUND OF THE INVENTION

The development of short wavelength light emitting devices is of great interest in the semiconductor arts. Such short wavelength devices hold the promise of providing increased storage density for optical disks as well as full-color displays and white light sources when used in conjunction with devices that emit light at longer wavelengths.

One promising class of short wavelength light emitting devices is based on group III nitride semiconductors. As used herein, the class of group III nitride semiconductors includes GaN, AlN, InN, BN, AlInN, GaInN, AlGaN, BAlN, BInN, BGaN, and BAlGaInN. To simplify the following discussion, "GaN semiconductors" includes GaN, and group III nitride semiconductors whose primary component is the GaN as in GaInN, AlGaN, BGaN, and BAlGaInN.

Light emitting diodes (LEDs) are fabricated on a GaN semiconductor having an active layer that generates light by recombining holes and electrons. The active layer is sandwiched between p-type and n-type contacts to form a p-n or n-p diode structure. A p-electrode and an n-electrode are used to connect the p-contact and n-contact, respectively, to the power source used to drive the LED. The overall efficiency of the LED may be defined to be the light emitted to the outside generated per watt of drive power. To maximize the light efficiency, both the light generated per watt of drive power in the active layer and the amount of light exiting from the LED in a useful direction must be considered.

A considerable amount of effort has been expended in prior art devices to maximize the light that is generated from the active layer per watt of drive power. It should be noted that the resistance of the p-type nitride semiconductor layer is much more than the resistance of the n-type nitride semiconductor layer. When the p-electrode is formed on the p-type nitride semiconductor layer, a semiconductor junction or ohmic junction is formed. In either case, there is a voltage drop across the junction, and hence, power is wasted at the junction. To reduce this voltage drop, the p-electrode is usually much wider than the n-electrode to lower the contact voltage.

While increasing the size of the p-electrode increases the amount of light generated in the active region per watt of input power, it leads to a decrease in the amount of light that exits the device, since most of the light exiting the device must now pass through the p-electrode. Accordingly, attempts have been made to maximize the transmittance of the p-electrode. A p-electrode having a transmittance of 40 to 50% has been constructed utilizing a multi-layered film of nickel and gold having an 8 nm gold film layer on a 1 nm of nickel layer. However, even with this relatively high transmittance, there is still considerable room for improvement.

In addition, this transparent p-electrode is too thin for bonding to the electrical conductors used to deliver the power to the LED. Hence, a thicker p-electrode region is required to form a bonding pad. A multi-layered film of nickel and gold having a thickness of several hundreds of nanometers is often used as the bonding pad. The bonding pad is typically a rectangle of the order of 100 microns on a side. Hence, a significant amount of light is lost in the thicker bonding pad regions.

However, even with the best prior art designs, the amount of light exiting the LED is 50% of that generated in the active region. If attempts are made to increase the output by using thinner p-electrodes, the resistance of the electrode increases. As a result higher drive voltages are required to overcome the increased resistance, and efficiency drops.

Broadly, it is the object of the present invention to provide an improved LED design.

It is a further object of the present invention to provide an LED with increased light output efficiency.

These and other objects of the present invention will become apparent to those skilled in the art from the following detailed description of the invention and the accompanying drawings.

SUMMARY OF THE INVENTION

The present invention is a light emitting device constructed on a substrate. The device includes an n-type semiconductor layer in contact with the substrate, an active layer for generating light, the active layer being in electrical contact with the n-type semiconductor layer. A p-type semiconductor layer is in electrical contact with the active layer, and a p-electrode is in electrical contact with the p-type semiconductor layer. The p-electrode includes a layer of silver in contact with the p-type semiconductor layer. In the preferred embodiment of the present invention, the n-type semiconductor layer and the p-type semiconductor layer are constructed from group III nitride semiconducting materials. In one embodiment of the invention, the silver layer is sufficiently thin to be transparent. In other embodiments, the silver layer is thick enough to reflect most of the light incident thereon and light exits via the substrate, which is transparent. A fixation layer is preferably provided over the silver layer. The fixation layer may be a dielectric or a conductor, the choice depending on whether or not the silver layer is transparent.

DETAILED DESCRIPTION OF THE DRAWINGS

The present invention achieves its advantages by utilizing a silver-based p-electrode. An LED according to the present invention can be constructed with either a reflective p-electrode and a transparent substrate or a transparent p-electrode and a reflective substrate. Embodiments of the present invention utilizing a reflective p-electrode will be described first.

The light generated in the active region of the LED exits the LED through the substrate when a reflective p-electrode is utilized. Light exiting the active region in the direction of the p-electrode is reflected back toward the substrate by the reflective p-electrode. The p-electrode utilizes silver as the first metal layer in at least a part of the p-electrode. In an optoelectronic device according to the present invention, a silver layer is vapor-deposited on the p-type nitride semiconductor layer and functions as the p-electrode and as a mirror for reflecting light back toward the transparent substrate.

Figure 1:
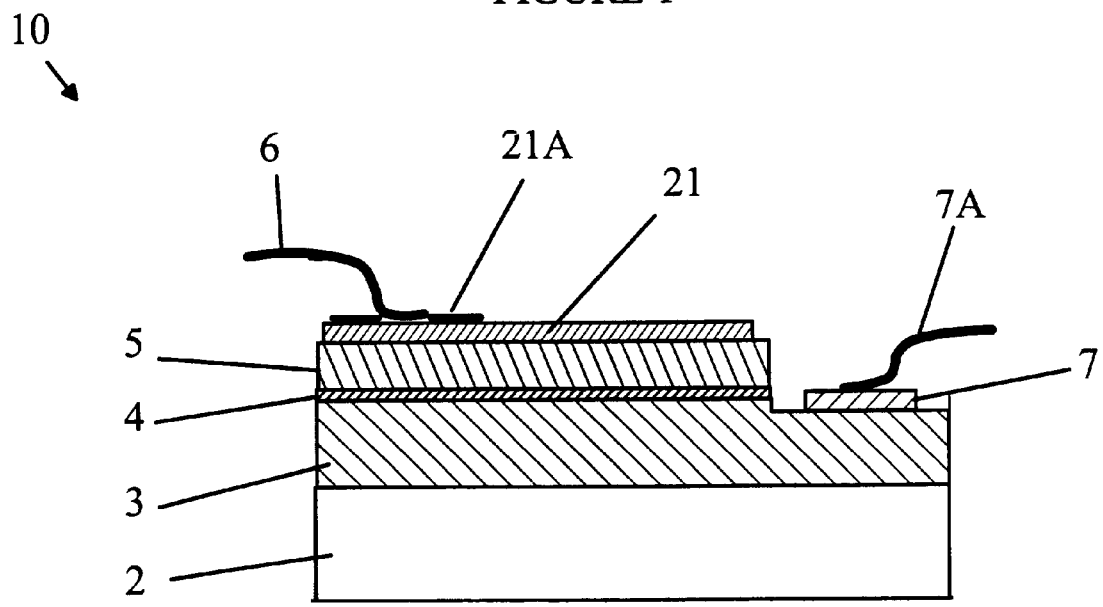
FIG. 1 is a cross-sectional view of an LED according to a first embodiment of the present invention.

Refer now to FIG. 1, which is a cross-sectional view of an LED 10 according to a first embodiment of the present invention. LED 10 is constructed on a sapphire substrate 2 by depositing an n-layer 3, an active layer 4 that is usually a multi-quantum well layer of a nitride semiconductor, and a p-layer 5. This series of layers is essentially that deposited in constructing a conventional LED up to the point of providing the p-electrode. LED 10 utilizes a silver (Ag) layer 21 as the first metal layer of the p-electrode. A second metal layer for bonding the p-lead wire 6 is constructed from nickel and gold and shown at 21A. An n-electrode 7 is also provided in the conventional manner together with a bonding pad for connecting the n-lead wire 7A.

The method by which LED 10 is fabricated will now be explained in more detail. First, conventional processes such as CVD are used to successively form n-layer 3, active layer 4, and p-layer 5 on a sapphire substrate 2. Next, the LED is patterned photolithography using nickel as the mask and is etched back into n-layer 3 to form the pad for n-electrode 7 by reactive ion etching. The nickel mask is then removed by applying aqua regia at room temperature.

The removal of the mask via aqua regia also cleans the surface of p-layer 5, and hence, aqua regia is preferred to other etchants for removing the nickel mask. The part is left in the aqua regia for 30 minutes to one hour. If the etching time is less than 30 minutes, the cleaning of the p-layer surface is insufficient, even though the nickel mask has been removed. Insufficient cleaning leads to a loss in the stability of the silver that is vapor-deposited on p-surface in the subsequent deposition steps. Hence, reducing the immersion time significantly below 30 minutes must be avoided.

Next, the LED part is activated for five minutes with sapphire substrate 2 at 900° C. in a nitrogen atmosphere. After the activation, the LED part is cleaned in hydrofluoric acid for 10 minutes at room temperature. A 100 nm layer of Ag is then vapor-deposited on p-layer 5 to form the first layer 21 of the p-electrode. It should be noted that the reflectance of the Ag layer does not improve substantially if the thickness is increased above 100 nm.

Next, about 300 nm of nickel and 50 nm of gold are successively vapor-deposited and patterned to form electrode metal layer 21A for bonding to the p electrode and a first annealing is performed (annealing 1).

Next, 10 nm of Ti and 200 nm of Al are successively vapor-deposited and patterned on the n-type GaN part to form n-electrode 7. A second annealing operation is then performed. The LED may then be separated from the other devices, such as other LEDs, formed on the same wafer. The LED is then mounted in a suitable package (not shown), the p-lead wire 6 is connected between the electrode metal layer 21A and a first bond pad (not shown) that forms part of the package, and the n-lead wire 7A is connected between the n-electrode 7 and a second bond pad (not shown) that forms part of the package. The LED is oriented in the package in a direction that allows light transmitted through the substrate 2 to be radiated from the package.

It should be noted that annealing 1 can be omitted. Annealing 1 is performed at or below 200° C., and annealing 2 is performed above 200° C., preferably above 400° C. The annealing operations are found experimentally to reduce the resistance of the p-contact.

The characteristics of an LED according to the present invention depend on the speed with which the silver is deposited and on the temperature of the sapphire substrate during the vapor deposition. It has been found experimentally that the preferred deposition conditions are a vapor deposition speed of approximately 0.05 nm/second or less and a temperature of the sapphire substrate 2 of 200° C. or less. At temperatures of 400° C., the silver layer becomes non-uniform, and the resistance of the silver layer increases. As noted above, the resistance of the p-electrode is a significant factor in the overall efficiency of the LED, and hence, such increases in resistance are to be avoided.

The silver-based p-electrode of the present invention is particularly well suited for reflective electrodes in the blue to green region of the spectrum. While palladium, platinum, nickel, gold, aluminum, chromium, and titanium layers could be utilized to create a reflective electrode, silver has a substantially higher reflectance than the other candidates. In addition, silver, unlike gold, aluminum, chrome, and titanium, forms an ohmic junction at the p-type GaN.

The portions of the silver layer that are not covered by the mounting pad 21A are preferably covered by a fixation layer that prevents reductions in the reflectance of the Ag layer over time. The fixation layer can be a metal or a dielectric.

Figure 2:
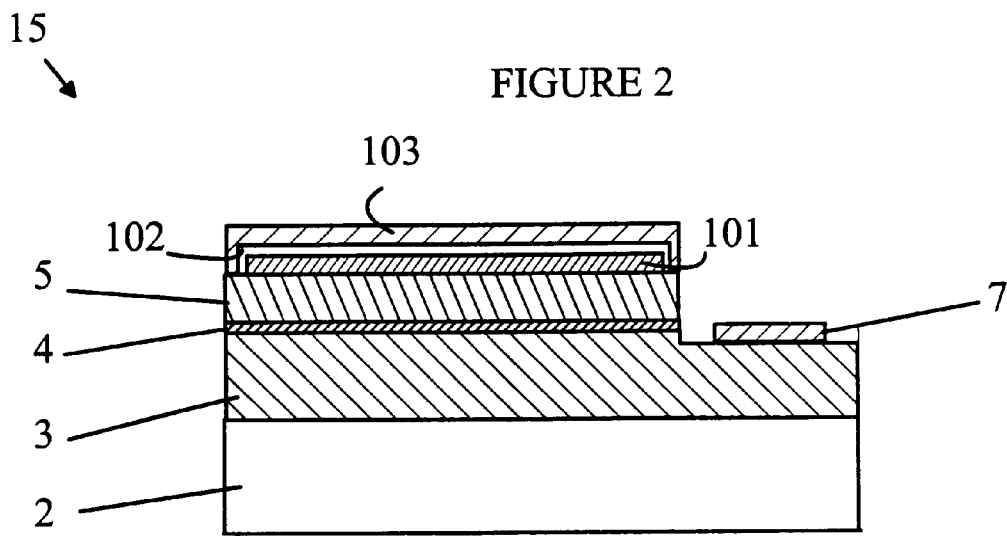
FIG. 2 is a cross-sectional view of an LED according to the present invention having a reflective p-electrode consisting of a 3-layered structure.

In one embodiment, the fixation layer is a metal layer that covers the entire silver layer and acts as a passivation layer that prevents the diffusion of the metal from the bonding layer into the silver layer. Refer now to FIG. 2 which is a cross-sectional view of an LED 15 according to the present invention having a reflective p-electrode consisting of a 3-layered structure that includes a diffusion barrier layer 102. To simplify the discussion, those elements that serve the same functions in LED 15 as elements in LED 10 shown in FIG. 1 have been given the same reference numbers. Silver layer 101 is covered with a diffusion barrier layer 102. Diffusion barrier layer 102 is covered by the bonding layer 103 to which wire or other bonding connections are made.

Diffusion barrier layer 102 prevents the constituents of bonding layer 103 from diffusing into silver layer 101. The diffusion barrier layer is preferably constructed from nickel and is vapor-deposited to a thickness up to 300 nm. In the preferred embodiment of the invention, diffusion barrier layer 102 also covers the side surfaces of silver layer 101 and seals the p-layer 5 and the silver layer 101. However, this sealing function may not always be required. Next, the metal for the bonding layer 103 is vapor-deposited. Gold with a thickness of 50 nm is preferred.

In the absence of a diffusion barrier layer, gold from the bonding layer diffuses into the silver layer and reduces the reflectivity of the silver layer. If the bonding layer covers only a small fraction of the p-electrode, the reduction in the overall reflectivity of the p-electrode is relatively small. However, when the bonding layer occupies a significant fraction of the pelectrode, the reduction in reflectivity is significant, and hence, the diffusion barrier layer provides a significant improvement.

The diffusion barrier layer 102 also improves the stability of the underlying silver layer 101. The diffusion barrier layer also functions as a metal fixation layer that improves the mechanical and electrical characteristics of the underlying silver layer. As a result of these improvements, the substrate temperature during the vapor deposition step in which the silver layer is formed can be lowered and the vapor deposition speed increased.

The above-described embodiments of the present invention utilized single layers for the diffusion barrier layer 102 and the bonding layer 103. However, it should be noted that the diffusion barrier layer 102 and/or the bonding layer 103 can be multi-layered structures.

Figure 3:
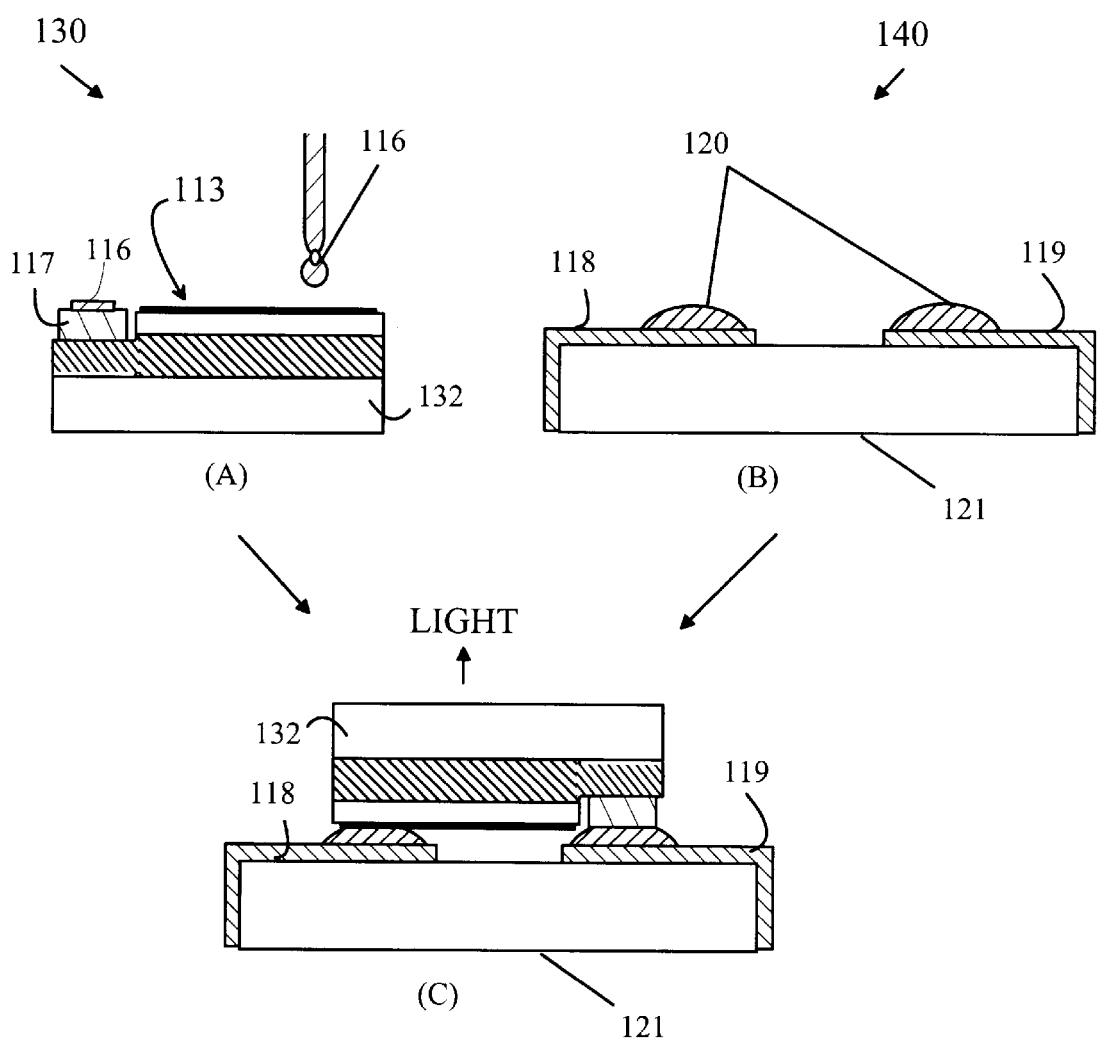
FIGS. 3(A)–(C) are cross-sectional views of an LED and package before and after mounting the LED on the package.

The reflective p-electrode discussed above is well adapted for LEDs that are to be "flip-chip" mounted. Refer now to FIGS. 3(A)–(C), which are cross-sectional views of an LED 130 and package 140 before and after mounting LED 130 on package 140. LED 130 is constructed on a transparent substrate 132. The p-electrode of LED 130 is shown at 113 and includes a bonding layer or bonding pad as described above. The n-electrode is shown at 117. In the packaging operation, p-electrode 113 is to be connected to a conductor 118 on the package, and n-electrode 117 is to be connected to conductor 119.

The bonding layer 103 shown in FIG. 2 is chosen to provide a compatible surface for making electrical connections between the electrodes and the conductors in the package. The connections are provided by depositing "bumps" 120 of a low melting-point metal such as indium on the package conductors. Similarly, a coating of a metal that will wet the low melting-point metal is deposited on the surface of the n-electrode and p-electrode as shown at 116. LED 130 is then inverted and placed in contact with package 140. The parts are then heated sufficiently to melt the low melting point metal thereby making the required connections. The final packaged part is shown in FIG. 3(C).

Figure 4:
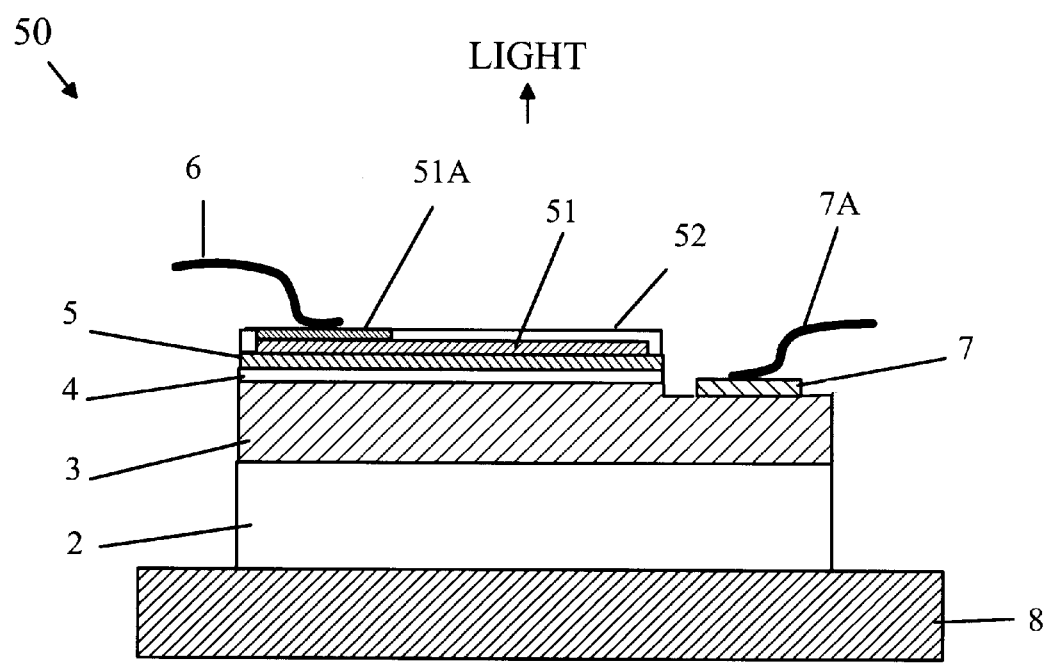
FIG. 4 is a cross-sectional view of another embodiment of an LED according to the present invention.

The above-described embodiments of the present invention have utilized a reflective silver-based p-electrode with the light exiting the LED through a transparent substrate. However, embodiments of the present invention having a transparent p-electrode can also be constructed utilizing silver. Refer now to FIG. 4, which is a cross-sectional view of another embodiment of an LED according to the present invention. To simplify the following discussion, the same reference numbers are utilized for parts that serve the same function as parts shown in FIG. 1. LED 50 differs from LED 10 shown in FIG. 1 in that silver layer 51 is thinner than silver layer 21 shown in FIG. 1, and a $TiO_2$ layer 52 is deposited on the p-electrode. Layer 52 helps to protect and stabilize the silver layer. In addition, $TiO_2$ layer 52 reduces the reflectance of the p-electrode as described below. The thinner silver layer improves the transmittance of the p-electrode.

Electrode metal layer 51A provides a bonding pad for connecting the p-electrode wire 6. This pad is similar to the electrode metal layer 21A shown in FIG. 1.

In this embodiment of the present invention, silver layer 51 has a thickness of 3 to 20 nm, preferably 10 nm. A silver layer becomes transparent when its thickness is less than 20 nm. It should be noted that at wavelengths below 500 nm, the absorption of silver is less than that of gold. Hence, this embodiment of the present invention is useful in constructing short wavelength LEDs with transparent p-electrodes.

It should be noted that a combined $TiO_2$(25 nm)/Ag(10 nm) film has a higher transmittance at wavelengths above about 360 nm than a single silver film. Hence, the $TiO_2$ film also improves the transmission of the p-electrode. The optimum thickness for the $TiO_2$ film depends on the wavelength of the light generated by the LED. The $TiO_2$ film provides an optical matching layer that reduces the reflections from the silver layer. The optimum thickness of the $TiO_2$ layer is independent of the thickness of the silver layer and is approximated by $25\lambda/450$, where $\lambda$ is the wavelength (in nm) of the generated light.

$TiO_2$ layer 52 is preferably deposited by vapor-deposition. When $TiO_2$ layer 52 is used, the conditions under which silver layer 51 is deposited are less critical than described above with respect to LED 10 shown in FIG. 1. In particular, the vapor deposition speed of silver can be increased.

It should be noted that other dielectric films may be used in place of $TiO_2$. For example, layer 52 may be constructed from $SiO_2$ or $Al_2O_3$.

In the preferred embodiment of the present invention, either the boundary of substrate package 8 and substrate 2 or the boundary of substrate 2 and n-layer 3 is reflective for light of the wavelength generated in active layer 4. Such a reflective layer assures that light leaving active layer 4 toward substrate 2 is reflected back toward the transparent p-electrode.

The above-described embodiments of the present invention have utilized a sapphire substrate. However, it will be obvious to those skilled in the art from the preceding discussion that other substrates may be utilized. In addition, the substrate may include one or more buffer layers, the n-type semiconductor layer being deposited on the last of these buffer layers. Accordingly, it is to be understood that the term "substrate" includes such buffer layers.

Similarly, the above-described embodiments of the present invention have been described in terms of a p-type semiconductor layer and an n-type semiconductor layer that sandwich an active layer that generates light when a potential is applied across the semiconducting layers. However, it will be obvious to those skilled in the art from the preceding discussion that each of these layers may include a number of sub-layers. Accordingly, it is to be understood that the term "layer" as used herein includes multi-layered structures.

Various modifications to the present invention will become apparent to those skilled in the art from the foregoing description and accompanying drawings. Accordingly, the present invention is to be limited solely by the scope of the following claims.

What is claimed is:

1. A light emitting device comprising:
    a substrate;
    an n-type semiconductor layer in contact with said substrate;
    an active layer for generating light, said active layer being in electrical contact with said n-type semiconducting layer;
    a p-type semiconductor layer in electrical contact with said active layer; and
    a p-electrode in electrical contact with said p-type semiconductor layer, said p-electrode comprising a layer of silver having a thickness greater than 20 nm in contact with said p-type semiconductor layer, wherein a portion of said generated light exits said device through said substrate after being reflected from said p-electrode, wherein said p-electrode further comprises a bonding layer in electrical contact with said layer of silver for making electrical connections to said layer of silver.

2. The light emitting device of claim 1 wherein said bonding layer comprises a metal chosen from the group consisting of gold and aluminum.

3. The light emitting device of claim 1 further comprising:
    an n-electrode comprising a layer of electrically conducting material in electrical contact with said n-type semiconductor layer; and
    a package having first and second conductors thereon for supplying power to said p-electrode and said n-electrode, respectively.

4. The light emitting device of claim 3 further comprising a metallic bonding layer between said first conductor and said p-electrode.

5. The light emitting device of claim 4 further comprising a bump in contact with said first conductor, wherein said bump comprises indium.

* * * * *